(12) United States Patent
Beachy et al.

(10) Patent No.: US 7,700,491 B2
(45) Date of Patent: Apr. 20, 2010

(54) STRINGER ELIMINATION IN A BICMOS PROCESS

(75) Inventors: Milton Beachy, Kissimmee, FL (US); Thomas Craig Esry, Orlando, FL (US); Daniel Charles Kerr, Orlando, FL (US); Thomas M. Oberdick, Windermere, FL (US); Mario Pita, Harmony, FL (US)

(73) Assignee: Agere Systems Inc., Allentown, PA (US)

( * ) Notice: Subject to any disclaimer, the term of this patent is extended or adjusted under 35 U.S.C. 154(b) by 1288 days.

(21) Appl. No.: 11/201,039

(22) Filed: Aug. 10, 2005

(65) Prior Publication Data

US 2007/0037395 A1 Feb. 15, 2007

(51) Int. Cl.
*H01L 21/302* (2006.01)

(52) U.S. Cl. .................. 438/706; 438/710; 438/719; 438/723; 438/734; 438/735; 438/737; 438/738

(58) Field of Classification Search ............... 438/706, 438/710, 714, 719, 723, 725, 735, 737, 738
See application file for complete search history.

(56) References Cited

U.S. PATENT DOCUMENTS

| | | | |
|---|---|---|---|
| 5,422,290 A | 6/1995 | Grubisch | |
| 5,811,315 A * | 9/1998 | Yindeepol et al. | 438/405 |
| 5,919,548 A | 7/1999 | Barron et al. | |
| 6,359,317 B1 | 3/2002 | Carroll et al. | |
| 6,433,401 B1 * | 8/2002 | Clark et al. | 257/524 |
| 6,475,915 B1 | 11/2002 | Wang | |
| 6,603,188 B1 | 8/2003 | Darwish et al. | |
| 6,797,188 B1 | 9/2004 | Shen et al. | |
| 6,797,580 B1 | 9/2004 | Yin et al. | |
| 6,962,842 B1 * | 11/2005 | Kalnitsky et al. | 438/202 |
| 2004/0121545 A1 * | 6/2004 | Chen et al. | 438/266 |
| 2007/0218635 A1 * | 9/2007 | Seliskar | 438/268 |

* cited by examiner

Primary Examiner—Anita K Alanko

(57) ABSTRACT

A method of preventing formation of stringers adjacent a side of a CMOS gate stack during the deposition of mask and poly layers for the formation of a base and emitter of a bi-polar device on a CMOS integrated circuit wafer. The stringers are formed by incomplete removal of a hard mask layer over an emitter poly layer over a nitride mask layer. The method includes overetching the hard mask layer with a first etchant having a higher selectivity for the emitter poly material than for the material of the hard mask, determining an end point for the overetching step by detection of nitride in the etchant and applying a poly etchant that is selective with respect to nitride to remove any residual emitter poly.

12 Claims, 5 Drawing Sheets

STRINGER ELIMINATION IN A BICMOS PROCESS

The present invention relates to manufacturing processes for semiconductor integrated circuits and more particularly to a method for preventing the formation of silicon dioxide and silicon oxi-nitride stringers during formation of a bi-polar base and emitter structure in BiCMOS processing.

BACKGROUND OF THE INVENTION

In the manufacture of vertical bipolar transistors in a BiCMOS integrated circuit, Typically, the emitter of the bi-polar device is formed after certain CMOS type devices have been created. Accordingly, the one or more layers with which the emitter are formed overlay the prior created CMOS devices, such as, for example, a gate stack formed over a drain and source region. Exemplary descriptions of the various processes for forming a BiCMOS device and the various steps in its manufacture are disclosed in U.S. Pat. Nos. 6,359,317; 6,797,580 and 5,422,290 which are incorporated herein by reference. A typical manufacturing sequence involves the deposition of an oxide layer, followed by depositing a polysilicon layer, then a hard mask layer such as silicon nitride and an overlayer such as a TEOS deposited silicon oxide. Then photoresist is deposited and patterned to define an emitter window. Following nitride spacer formation and selective growth of a SiGe base, a silicon nitride is deposited and etched to form a second nitride spacer. Subsequently, a layer of doped polysilicon is deposited to form the emitter. Another hard mask layer may then be deposited over the polysilicon layer followed by a photoresist mask. At this point, the process involves systematic removal of the layers of material over the surface of the wafer other than the regions in which the bi-polar devices are formed, e.g., the CMOS regions.

One result of the above described deposition sequence is that the layers of deposited material create a surface that is not flat, i.e., because the surface may have various vertically extending features such as a CMOS gate stack. As subsequent layers are formed above the semiconductor wafer, they extend over these vertically oriented features and appear as sidewall layers along the sides of the devices. Quite often, these sidewalls, when measured perpendicularly to the wafer surface, are thicker than the layers along relatively flat surface regions of the wafer. As a result, when the layers are later removed, the process of removal for each layer may terminate before the vertically formed layer is completely removed. These remaining portions are typically referred to as stringers and have required additional processing for their removal thus contributing to a slower throughput in wafer processing.

Commonly, stringers that are left after formation of the bi-polar emitter and removal of the unused portions of the deposited layer may be formed of $SiO_2$ (silicon dioxide) and $SiO_xN_y$ (silicon oxi-nitride). In the past, removal of the $SiO_2$ and $SiO_xN_y$ stringers on or near the vertical sidewalls of a CMOS gate structure has been effected by overetching during hard mask removal to selectively remove the stringers. The overetching should avoid significant etching into the polysilicon layer that is used to form the bi-polar device emitter. The emitter is then defined using an etch chemistry which is selective with respect to $SiO_2$. This limits the amount of silicon dioxide stringer removal. The combination of the hard mask etch and emitter etch, is self limiting with regard to the amount of stringer that can be removed. More particularly, the hard mask etch is limited by the process selectivity of silicon oxide to polysilicon while the poly emitter etch is typically selective toward silicon dioxide, only removing a limited amount of the stringer left over from the hard mask etch step. As a result, some bumps and/or stringers are left after etching, particularly in the tight spaces of the CMOS gate stack.

DETAILED DESCRIPTION OF THE INVENTION

Figure 1:
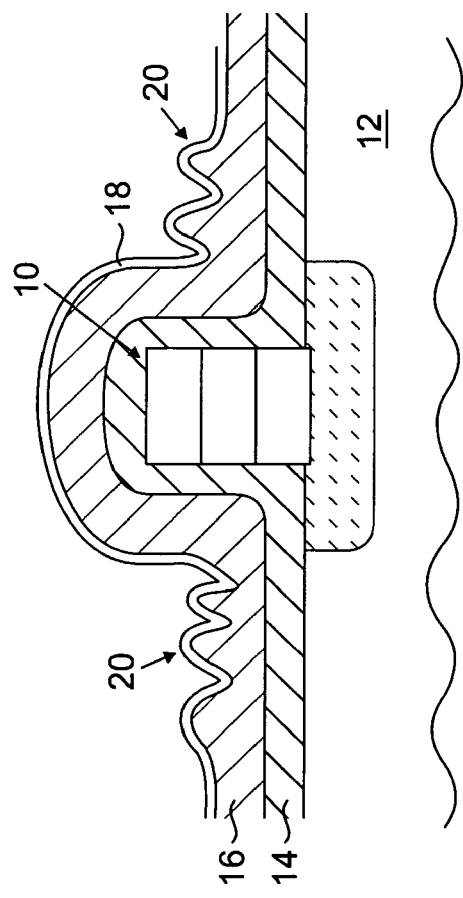
FIG. 1 is a representation of a cross-section of a CMOS gate stack after a prior art etch.
Figure 2:
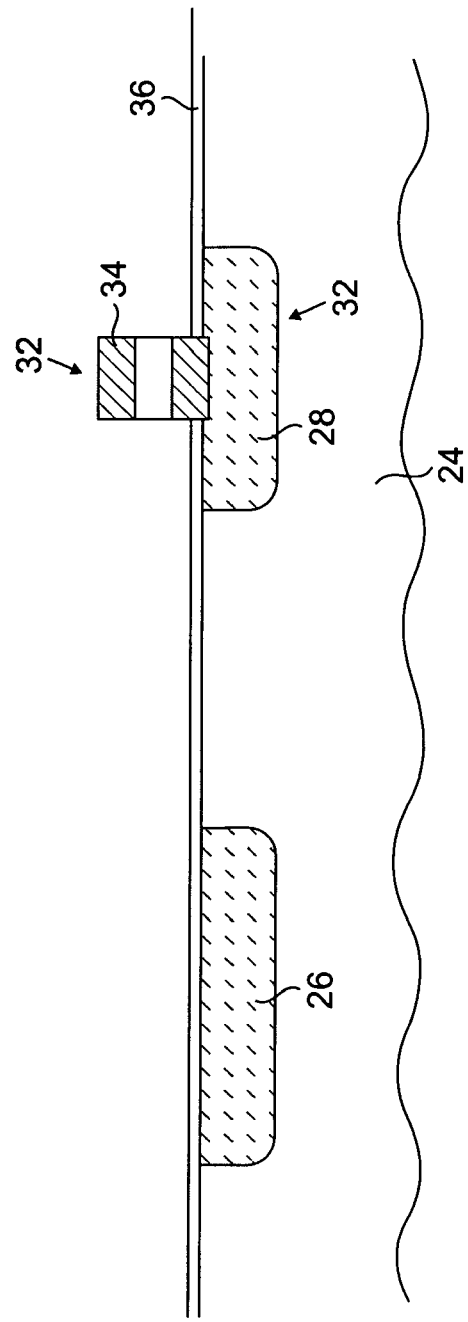
FIG. 2 is a cross-sectional representation of a BiCMOS structure prior to deposition of layers for the bi-polar device.

Referring first to FIG. 1, there is shown a schematic representation of a cross-sectional view of a CMOS gate stack 10 on a substrate 12 after deposition of various layers of oxide, nitride and poly to create a base-emitter structure for a bi-polar device on an integrated circuit wafer designed for and containing a plurality of CMOS devices. In this simplified view, an oxide layer 14 extends over the gate stack 10 and is covered by a base poly layer 16. A silicon nitride layer 18 can also be seen on the poly layer 16. The cross-section of FIG. 1 is taken subsequent to a conventional poly emitted etch process. What is noticeable about this view is the formation of bumps or stringers 20 on each side of the gate stack 10. These stringers 20 are formed as a result of the prior etch steps not be effective in completely removing the vertically extending portions of the various mask and poly layers during the etch processes. As will become apparent, applicants' inventive processes remove the vertical sidewall formations and prevent the formation of such stringers.

Figure 3:
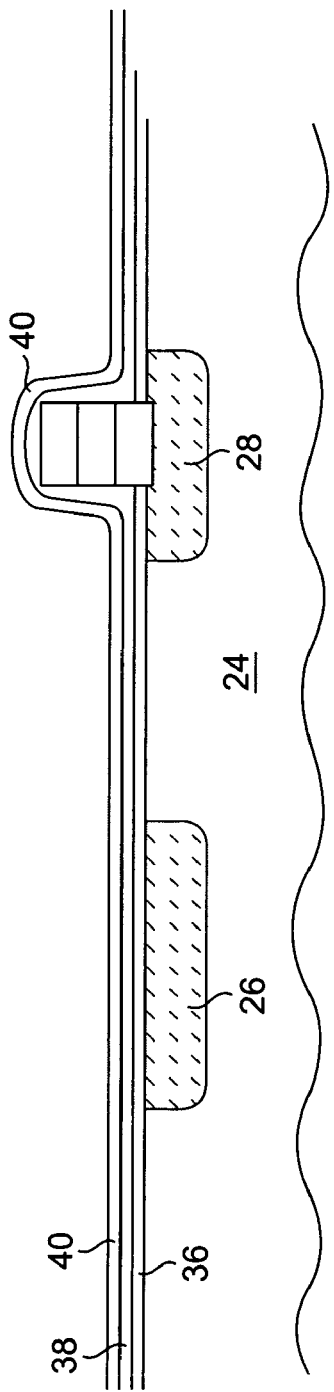
FIG. 3 shows the structure of FIG. 2 after deposition of a TEOS layer.

Creation of a bi-polar device in a CMOS structure and elimination of stringers will be better understood from the following description of FIGS. 2-9. Considering FIG. 2, there is shown a partial cross-sectional illustration of a wafer structure 22 having a substrate 24 in which have been formed by means well known in the art a collector region 26 for a bi-polar device and a source and a drain region 28 for a CMOS device 32. A gate stack for the CMOS device is indicated at 34. At this stage of formation, only an initial oxide layer 36 of TEOS (tetraethylorthosilicate) typically about 180 Å in thickness has been deposited on the substrate 24 and does not cover the CMOS gate stack 34. In FIG. 3, an additional TEOS spacer layer 38 has been deposited over the wafer surface, including the gate stack 34, and an amorphous silicon poly layer 40 is deposited over the spacer layer 38. The layer 40 is commonly referred to as the base poly layer.

Figure 4:
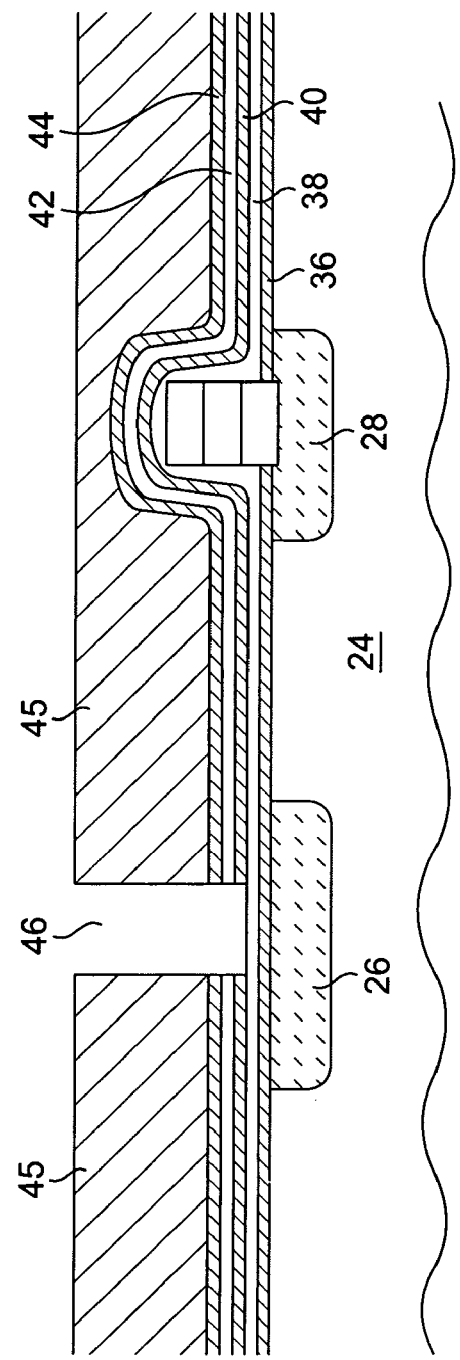
FIG. 4 shows the structure of FIG. 3 after deposition of a nitride layer and second TEOS layer.
Figure 5:
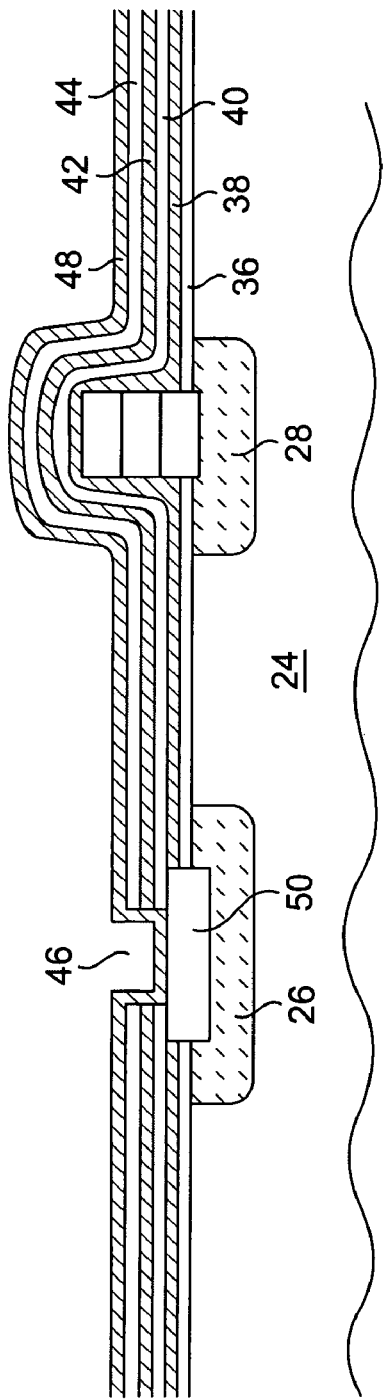
FIG. 5 shows the structure of FIG. 4 following an initial etch and base growth.
Figure 6:
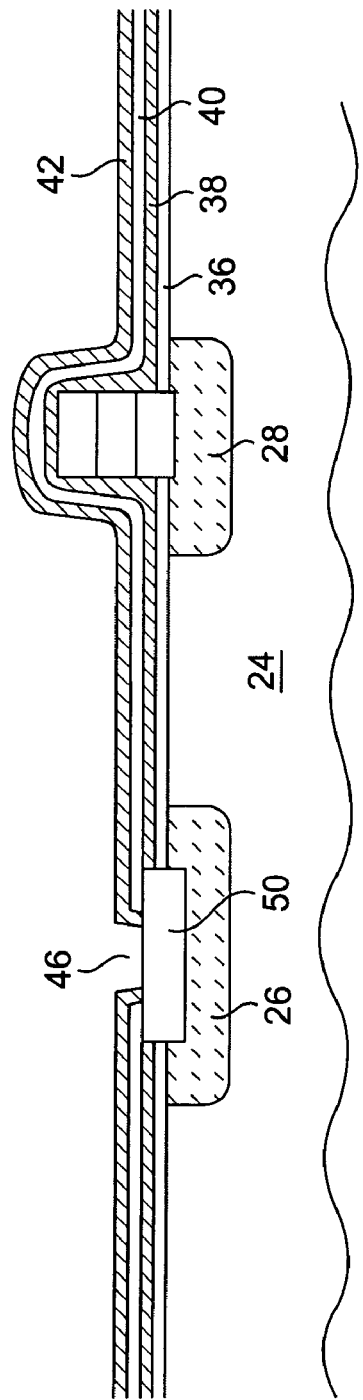
FIG. 6 shows the structure of FIG. 5 following a nitride etch.
Figure 7:
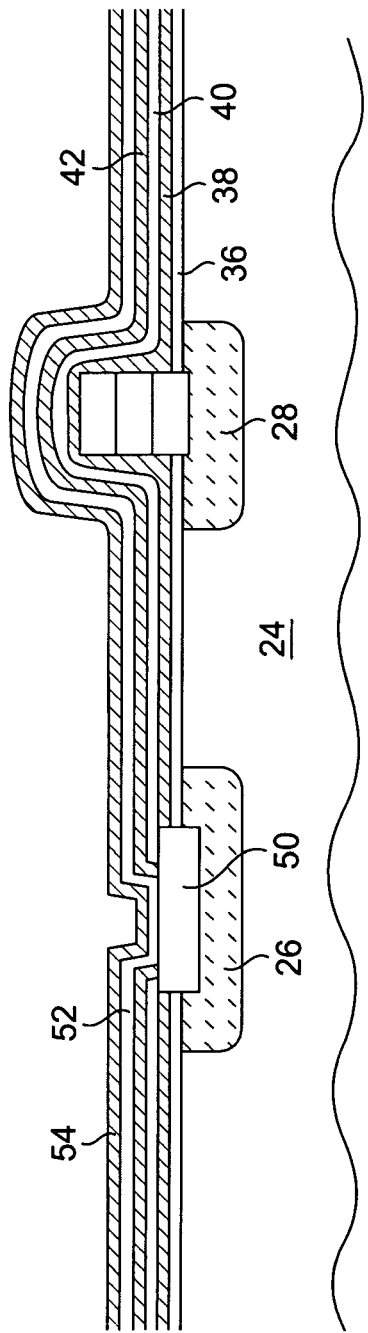
FIG. 7 shows the structure of FIG. 6 following deposition of a TEOS layer and another nitride layer.
Figure 8:
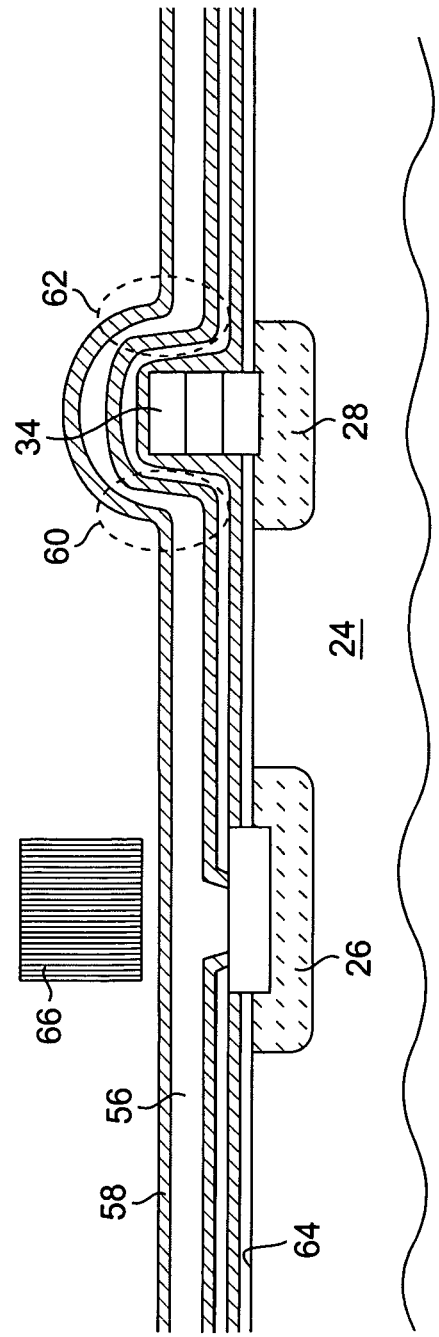
FIG. 8 shows the structure of FIG. 7 following an etch process to remove the last deposited nitride layer and TEOS layer to provide sidewall protection.

In FIG. 4, a silicon nitride layer 42 (typically, Si3N4,) has been deposited over the base poly layer 40. The nitride layer 42 is typically about 1800 Å and is then covered by another TEOS layer 44 of about 180 Å thickness. The surface is then covered with photoresist 45 and exposed through a mask in preparation for forming the emitter window 46. Once the window 46 has been etched, the photoresist is removed and another silicon nitride layer 48 is deposited over the TEOS layer 44 and into the window 46 as shown in FIG. 5. The layer 48 is used to provide sidewall masking within the window 44 and is much thinner than the layer 42, generally about 400 Å. The layer 48 is then etched from the wafer surface down to the TEOS layer 44, leaving a thin nitride layer protecting the inner sidewalls of the window 46. At this time, the base 50 for the bi-polar device is epitaxially grown in the window 46, extending into the TEOS layers 36,38 under the poly base layer 40 as shown in FIGS. 5 and 6. FIG. 6 shows the initial sidewall formation within the window 46 after etching and removal of the nitride layer 48. Following formation of the base 50, another TEOS layer 52 is deposited over the nitride layer 42 and another silicon nitride layer 54 is deposited over the TEOS layer 52 resulting in the structure as shown in FIG. 7. This nitride layer 54 is then removed by plasma etching followed by removal of the TEOS layer 52. The result is to create a sidewall barrier within window 46 that comprises a pair of nitride layers spaced by a TEOS layer as shown in FIG. 8, which Fig. also shows the emitter poly layer 56. Layer 56 is a doped poly deposited using conventional techniques.

At this time in the process, the bi-polar device has been completed and it is now necessary to remove all the deposited layers from the other surfaces of the wafer without disturbing the formed base-emitter stack for the bi-polar device. The first step to protect the device is to deposit a hard mask layer 58, typically USG (undoped silica glass), over the wafer followed by coverage with photoresist. Using standard photoresist processes, the bi-polar device is protected as shown in FIG. 8. In this final form, it can be seen that the various layers have segments at 60, 62 that extend away from the plane of the wafer surface 64 as the layers pass over such elements on the surface as the gate stack 34. Considering the wafer surface as lying in a horizontal plane, the vertically extending segments 60, 62 have a thickness in the vertical direction that is substantially greater than the thickness of the layers lying on the horizontal wafer surface. Consequently, when etching is performed, the horizontal portion of a layer will be removed prior to the time that the vertical segments are removed. The failure to remove these vertical segments results in the formation of the stringers 20 that were illustrated in FIG. 1. Accordingly, applicants' inventive process is directed to complete removal of these vertical segments in order to prevent the formation of such stringers.

The first etch step removes the USG hard mask 58 from all areas except over the bi-polar emitter stack that is protected by the PR layer 66. The conventional etching process for the removal of the hard mask layer 58 uses a plasma etchant mixture of $CHF_3$ and $CF_4$ (a carbon/flouride plasma with high Carbon to Flourine ratio) that is selective to the poly of layer 56. $CHF_3$ is sometimes referred to as flouroform while $CF_4$ is sometimes referred to as fluorocarbon. Once the mask layer 58 is removed, the conventional process switches to a poly etch process using a different etchant typically in a different tool. This requires removing the wafer from one tool and placing it in another and consumes valuable process time. Applicants have found that the $SiO_2$ plasma etch chemistry can be used to etch the poly layer. More particularly, applicants have found that the $SiO_2$ plasma etching chemistry etches the sidewalls or segments 60, 62 formed by the oxide layer 58 adjacent perpendicular structures, such as the CMOS gate stack 34, from 3 to 5 times faster than the poly layer 56 so that when the poly layer etching is completed, the sidewalls 60, 62 of USG have been etched 3 to 5 times the height of the poly layer. In practice, the inventive etch step may be carried out as part of an in situ etch process in which a poly emitter hard mask and antireflective coating (ARC) layers, a poly emitter and a base isolation nitride layer are all etched. In addition, the hard mask photoresist 66 is removed during the process.

In practicing the etch process as taught by applicants, the USG layer 58, which is chemically $SiO_2$, is removed using a mixture of CF4 and CHF3, where the ratio of CHF3 to CF4 is chosen to provide a desired selectivity of the oxide to the polysilicon layer 56. The typical chemistry can be expressed as $SiO_2 + CF_4 + CHF3 \rightarrow SiF_4 + HF + CO_2$. Complete removal of the oxide layer 58 can be detected using conventional end point detection of $CO_2$, i.e., the lack of $CO_2$ in the effluent from the plasma etch indicates that the oxide layer has been exhausted. In the inventive process, the fluorocarbon plasma is continued and used to remove the poly layer. While this etch process using the oxide etch plasma may not be as efficient as a conventional poly etch process, the oxide etch plasma will effectively remove the poly, although at a slower etch rate than for the oxide. However, the advantage of this inventive process is that it gives the etchant time to completely remove the oxide at segments 60,62 that have been the cause for stringer formation in conventional etch processes.

The invention uses the hard mask etch chemistry having from 3:1 to 5:1 $SiO_2$ to emitter poly selectivity. However, instead of doing a conventional amount of etching needed for this process, the invention uses essentially a 200% over etch combined with endpoint detection to etch all the poly emitter layer. More particularly, an endpoint for the oxide plasma etch can be detected by monitoring for cyanide (CN) in the effluent from the etch tool, i.e., when the fluorocarbon plasma reaches the nitride layer 42 which is generally $Si_3N_4$, the carbon ions will bond with nitrogen ions to create cyanide.

In a typical structure, the poly emitter layer is about 2000 angstroms thick while the CMOS gate stack is about 5000 angstroms high. To remove the stringers along the side of the gate stack requires removing the 5000 angstroms of $SiO_2$ when the 2000 angstroms of poly emitter layer is removed. This requires about a 3:1 selectivity of $SiO_2$ to polysilicon to make sure that the full height of the stringers is removed when the poly emitter etch is complete.

After removal of the poly with the oxide etch, a poly over etch can then be performed to make sure that there are no residuals on the wafer surface or gate stack sidewalls. The poly over etch is performed with a conventional poly etch process and chemistry which is selective to oxide and nitride, i.e., it does not remove the oxide or nitride and, if such layer segments were not removed by another etch process, would result in the creation of the stringers. The poly overetch is typically a timed etch since it does not effect the nitride layer. The time can be set long enough to assure that any poly stringers are removed before proceeding to a nitride etch process. One of the advantages of the present invention is that the chemistry for both the oxide etch and poly etch can be carried out in the same tool so that the wafer does not have to be removed until these first two processes are completed. In the manufacturing process, once the oxide and poly have been removed, the wafer can be transferred to another tool for nitride etch using conventional processes and endpoint detection such as the absence of cyanide in the effluent. An in-situ process to selectively remove this nitride layer over the base poly could be used to further simplify the manufacturing process.

By way of example, for an etch process of a wafer having the parameters set forth above, i.e., emitter poly of about 2000 Angstroms, the process parameters are as follows:

|   | Typical Poly Etch Chemistry | | SiO$_2$ Type Chemistry for Poly Emitter Etch | |
|---|---|---|---|---|
| Source Power: | 200 | watts |  | 700 watts |
| Bias Power: | 40 | watts |  | 120 watts |
| Pressure: | 5 | mtorr |  | 6 mtorr |
| HBr flow: | 60 | sccm | CHF3 flow: | 60 sccm |
| He/30% O$_2$ flow: | 10 | sccm | CF4 flow: | 20 sccm |
|   |   |   | Ar flow: | 10 sccm |

Using the etch process described herein for the removal of stringers on a BiCMOS gate stack assures complete removal of the stringers and improves device yield. In a typical application for the illustrative bi-polar device, the oxide etch takes approximately 80 seconds while removal of the poly layer takes about another 150 seconds with the SiO$_2$ etch chemistry. The final poly etch using poly etch chemistry takes about another 85 seconds. These times are only illustrative and will vary with the chemistry and physical settings in the tool and the thickness of the layers.

Figure 9:
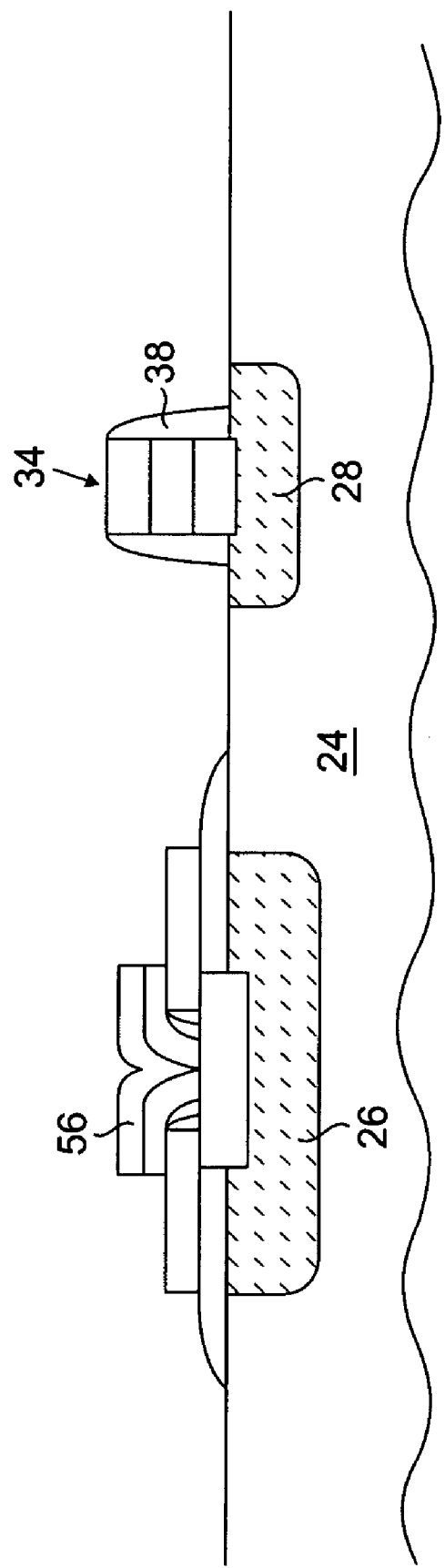
FIG. 9 illustrates the end product of the inventive process with formation of stringers being inhibited.

FIG. 9 illustrates the end point for the illustrative process set forth above showing that the bi-polar device has been completed and the gate stack 34 is finished without formation of stringers.

As noted above, the advantages of the inventive process are that the oxide hard mask and poly layers may both be removed in the same tool and the stringers are removed during the etch process without having to make adjustments after removal of the poly. Further, while the examples given are for the purpose of explaining the invention, it will be recognized that the etch chemistry may be varied to achieve different results or to etch layers having different elements.

While the invention has been described in what is presently considered to be a preferred embodiment, various modifications and improvements will become apparent to those skilled in the art. It is intended therefore that the invention not be limited to the specific disclosed embodiment but be interpreted within the full spirit and scope of the appended claims.

What is claimed is:

1. A method of preventing formation of stringers adjacent a side of a CMOS gate stack during the deposition of mask and poly layers for the formation of a base and emitter of a bi-polar device on a CMOS integrated circuit wafer, the stringers comprising a hard mask layer over an emitter poly layer over a nitride mask layer, the method comprising:
   overetching the hard mask layer with a first etchant having a higher selectivity for the emitter poly material than for the material of the hard mask;
   determining an end point for the overetching step by detection of nitride in the etchant; and
   applying a poly etchant that is selective with respect to nitride to remove any residual emitter poly.

2. The method of claim 1 wherein the hard mask layer comprises a silicon dioxide layer and the first etchant comprises CHF$_3$, CF$_4$ and Ar.

3. The method of claim 2 wherein the poly etchant comprises HBr, He and O$_2$.

4. The method of claim 1 and including removing the wafer from a tool in which the first and poly etchant steps were performed and placing the wafer in another tool to remove the nitride layer.

5. The method of claim 1 wherein the first etchant comprises a combination of flouroform and fluorocarbon in a plasma etch.

6. A method of removing stringers formed adjacent a side of a CMOS gate stack during the deposition of mask and poly layers for the formation of a base and emitter of a bi-polar device on a CMOS integrated circuit wafer, the stringers comprising a hard mask layer over an emitter poly layer over a nitride mask layer, the method comprising:
   overetching the hard mask layer with a first etchant having a higher selectivity for the emitter poly material than for the material of the hard mask;
   determining an end point for the overetching step by detection of nitride in the etchant; and
   applying a second etchant to remove any residual emitter poly, the second etchant being selective to nitride.

7. The method of claim 6 wherein the hard mask layer comprises a silicon dioxide layer and the first etchant comprises CHF$_3$, CF$_4$ and Ar.

8. The method of claim 6 wherein the second etchant comprises HBr and HeO$_2$.

9. The method of claim 6 and including removing the wafer from a tool in which the first and second etch steps were performed and placing the wafer in another tool to remove the nitride layer.

10. A method for elimination of stringers in a BiCMOS device comprising:
   providing an integrated circuit wafer having at least one layer with a formed CMOS device including a gate stack extending generally perpendicularly from a surface of the layer and having a collector region of a bi-polar transistor formed in the layer spaced from the CMOS device;
   depositing an oxide layer over the at least one layer and the gate stack;
   depositing a first polysilicon layer over the oxide layer;
   depositing a first hard mask layer over the polysilicon layer;
   applying photoresist over the hard mask layer and exposing the photoresist to define an emitter window over the collector region;
   etching the applied layers to form the emitter window;
   forming a sidewall protective layer within the emitter window;
   depositing a second polysilicon layer over the nitride layer to form an emitter for the bi-polar device;
   depositing a second hard mask layer over the second polysilicon layer;
   applying a photoresistor layer over the second hard mask layer to define the area of the bi-polar device in preparation for removal of the deposited layers creating the bi-polar base and emitter regions;
   applying an initial plasma etch to the wafer wherein the plasma etch is selected to remove the second hard mask layer and continuing to apply the plasma etch until the nitride layer has been reached;
   changing the plasma to a poly etch chemistry and further etching for a time period sufficient to assure removal of the remaining poly layer; and
   moving the wafer to another tool for etching the remaining layers on the wafer surface.

11. A method of preventing formation of stringers adjacent a side of a CMOS gate stack during the deposition of mask and poly layers for the formation of a base and emitter of a bi-polar device on a CMOS integrated circuit wafer, the sidewalls normally being formed by incomplete removal of a hard mask layer and underlying emitter poly layer, the method comprising:

overetching the hard mask layer with a first etchant having a higher selectivity for the emitter poly material than for the material of the hard mask;

determining an end point for the overetching step; and applying a poly etchant that is selective with respect to any material directly under the poly layer to remove any residual emitter poly.

12. The method of claim 11 wherein the material under the poly layer comprises a nitride material and the step of determining an end point for the overetch step comprises detection of nitride in effluent from the etch process.

* * * * *